Jan. 31, 1967 E. L. DIX 3,302,124
TRANSISTOR PULSE AMPLIFIER TO ELIMINATE BASELINE NOISE
Filed Oct. 28, 1963

INVENTOR
EDGAR L. DIX
BY James D Murray AGENT
Richard Reed ATTORNEY

United States Patent Office 3,302,124

Patented Jan. 31, 1967

3,302,124
TRANSISTOR PULSE AMPLIFIER TO ELIMINATE BASELINE NOISE

Edgar L. Dix, Oxon Hill, Md., assignor to the United States of America as represented by the Secretary of the Navy Filed Oct. 28, 1963, Ser. No. 319,617
2 Claims. (Cl. 330—23)

The invention described herein may be manufactured and used by or for the Government of the United States of America for governmental purposes without the payment of any royalties thereon or therefor.

This invention relates generally to electronic amplifying circuits and more particularly to transistor amplifying circuits which are temperature compensated and which provide an adjustable threshold level for signal amplification with noise rejection.

There has arisen in the modern technology, particularly in the technology relating to space exploration, a need for electronic amplifiers which are small in size and power requirements, which are operationally stable in widely varying ambient temperatures and which will reject noise of substantial magnitude while amplifying the intelligence bearing portion of the signal. Circuits satisfying such a need, while obviously broadly useful, are especially advantageous in pulse type applications wherein intelligence must be reliably distinguished from noise to prevent inadvertent triggering of devices such as computers and command circuits and where operational stability must be maintained under conditions of widely varying temperature.

In previous pulse amplifying circuits it has been conventional to use both vacuum tubes and transistors as the amplifier components. These circuits have not proven entirely satisfactory in many operational areas because of the relatively large power and space requirements of vacuum tubes and because transistor characteristics vary by a significant amount as a result of large environmental temperature changes.

It is, therefore, an object of this invention to provide an electronic circuit which amplifies a signal and rejects noise.

A further object of the invention is the provision of an electronic circuit which is substantially insensitive to temperature changes and which amplifies a signal and rejects noise.

A still further object of the present invention is to provide a biased transistor amplifying circuit which is temperature compensated and which amplifies a signal and rejects noise of a magnitude smaller than an adjustable threshold level.

Other objects and advantages of the invention will hereinafter become more fully apparent from the following description and the annexed drawing wherein.

The present invention contemplates the use of a transistor in an amplifying circuit in which the temperature induced changes in the transistor characteristics are compensated by a forward biased silicon diode and in which the threshold level of the transistor is adjusted by means of a variable resistor connected in parallel with the diode.

Figure 1:
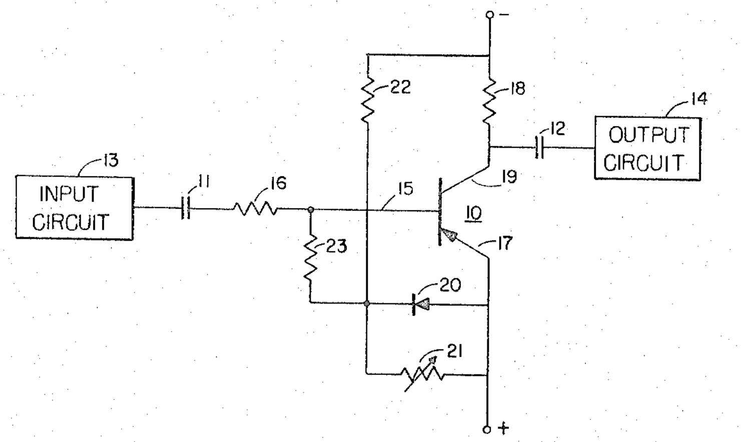
FIG. 1 shows an embodiment of the invention.

Describing the invention more specifically and referring to FIG. 1 which illustrates an embodiment of the invention, the transistor 10, which may be of the silicon PNP type, is connected as an amplifier in a common emitter circuit. The capacitors 11 and 12 couple this circuit to the input and output circuits 13 and 14 and also serve to isolate the amplifier circuit from any DC currents which may be present in the input and output circuits.

An input signal, which may include noise, is applied to the base 15 of transistor 10 through capacitor 11 and limiting resistor 16. The emitter 17 of transistor 10 is connected to a potential which is a common reference potential to both the input and output circuits and which typically could be ground.

An amplified output signal, which is coupled to output circuit 14 by capacitor 12, is developed across the load resistor 18 which is connected between the collector 19 of transistor 10 and a source of negative potential.

Diode 20, which could be a silicon type, is connected in parallel with variable resistor 21 and in series with resistor 22 to develop the base bias which is applied through the base return resistor 23.

The temperature sensitive characteristics of diode 20 and transistor 10 are chosen so that a change in the ambient temperature will not cause a change in the threshold potential of the amplifier circuit. For a typical PNP silicon transistor 10, an increase in ambient temperature will decrease the size of the input signal required to produce an output signal. To compensate for this change in the threshold potential the temperature characteristics of diode 20 are chosen so that an increase in ambient temperature will result in a decrease of the diode impedance and a resulting decrease in the transistor emitter-base bias, thereby maintaining the transistor threshold potential constant as the ambient temperature changes.

Figure 2:
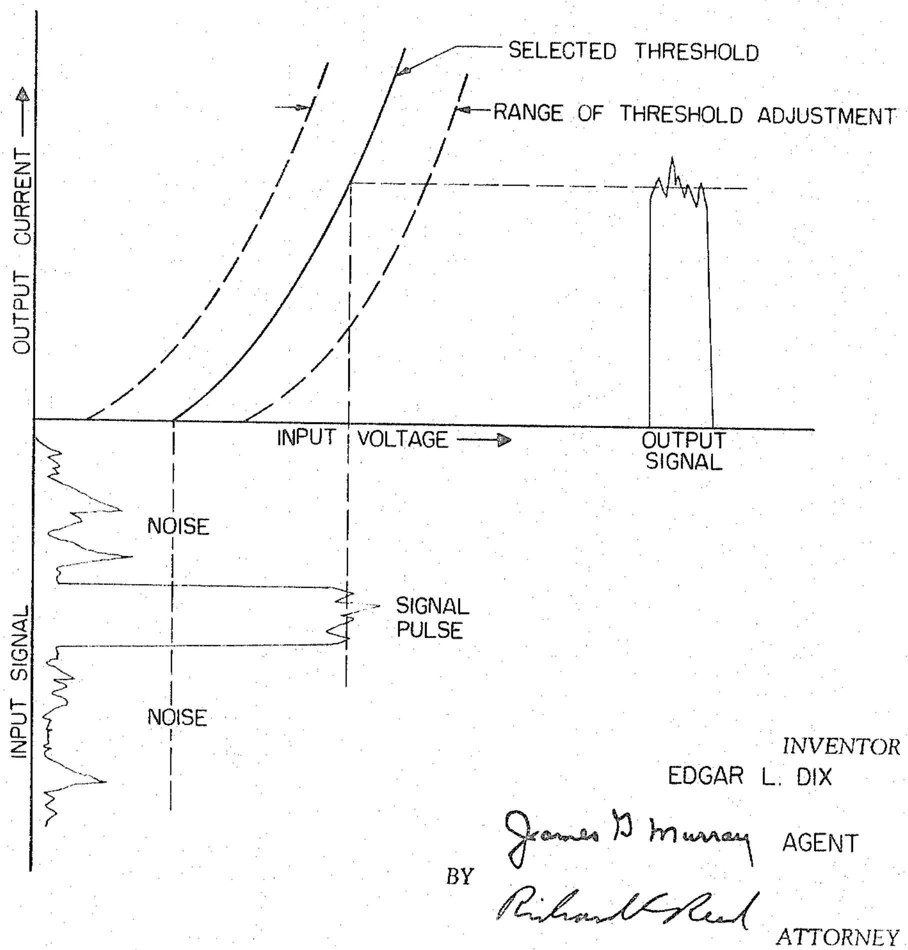
FIG. 2 is a transfer characteristic diagram which is helpful in understanding the operation of the circuit illustrated in FIG. 1.

The operational characteristic of the circuit of FIG. 1 will now be apparent and are illustrated in the transfer characteristic curves shown in FIG. 2. Variable resistor 21, which may be calibrated, is adjusted to establish the emitter-base bias and threshold potential corresponding to the desired level of noise suppression. As shown in FIG. 2, all noise which occurs when the input signal is below the threshold potential does not appear in the output signal, thereby eliminating the danger of inadvertent triggering of devices which utilize the output signal. The noise suppression level and other operating characteristics of the circuit are preserved essentially constant under temperature varying conditions due to the compensating effect of diode 20.

The described embodiment of the invention is substantially insensitive to temperature changes and amplifies a signal and rejects noise of a magnitude smaller than an adjustable threshold level.

Obviously the transistor and diode could be made of materials other than silicon and the described circuit could be modified to include a NPN type transistor. Other modifications and variations of the present invention are also possible in the light of the above teachings. It is therefore to be understood that within the scope of the appended claims the invention may be practiced otherwise than as specifically described.

What is claimed is:

1. An amplifier comprising:

A temperature sensitive transistor having an emitter, a base and a collector;

An input signal circuit connected to said base;

A positive source of potential connected directly to said emitter;

A negative source of potential;

A first impedance connected between said negative source of potential and said collector; and Impedance network means connected between said base and said positive source of potential, said means functioning to adjustably control the threshold level of said transistor so that said transistor will amplify input signals larger than said threshold level and will suppress input noise signals smaller than said threshold level and further functioning to stabilize said threshold level by compensating for changes in the characteristics of said transistor due to temperature variations.

2. An amplifier as set forth in claim 1 wherein said impedance network means include a temperature sensitive diode connected in parallel with a variable impedance and said parallel connected diode and variable impedance are connected to said negative source of potential through a second impedance.

References Cited by the Examiner

UNITED STATES PATENTS

| | | | |
|---|---|---|---|
| 3,050,644 | 8/1962 | Ironside | 330—23 X |
| 3,105,198 | 9/1963 | Higginbotham | 330—23 X |

FOREIGN PATENTS

| | | |
|---|---|---|
| 1,127,404 | 4/1962. | Germany. |

ROY LAKE, *Primary Examiner.*

N. KAUFMAN, *Assistant Examiner.*